(12) United States Patent
Tung et al.

(10) Patent No.: US 8,980,745 B1
(45) Date of Patent: Mar. 17, 2015

(54) INTERCONNECT STRUCTURES AND METHODS OF FORMING SAME

(71) Applicant: Taiwan Semiconductor Manufacturing Company, Ltd., Hsin-Chu (TW)

(72) Inventors: Szu-Ping Tung, Taipei (TW); Huang-Yi Huang, Hsin-Chu (TW); Wen-Jiun Liu, Zhunan Township (TW); Ching-Hua Hsieh, Hsin-Chu (TW); Minghsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/019,276

(22) Filed: Sep. 5, 2013

(51) Int. Cl.
*H01L 21/44* (2006.01)
*H01L 21/768* (2006.01)
*H01L 23/522* (2006.01)

(52) U.S. Cl.
CPC ...... *H01L 21/76879* (2013.01); *H01L 23/5226* (2013.01)
USPC ............................ 438/666; 257/773; 438/742

(58) Field of Classification Search
CPC ................... H01L 21/76892; H01L 21/76879; H01L 23/5226
USPC ...................................... 438/666, 742; 257/773
See application file for complete search history.

(56) References Cited

U.S. PATENT DOCUMENTS 7,868,455 B2 * 1/2011 Chen .............................. 257/750

* cited by examiner

*Primary Examiner* — Tu-Tu Ho
(74) *Attorney, Agent, or Firm* — Slater & Matsil, L.L.P.

(57) ABSTRACT

A semiconductor device, an interconnect structure, and methods of forming the same are disclosed. An embodiment is a method of forming a semiconductor device, the method including forming a first dielectric layer over a substrate, forming a first conductive layer in the first dielectric layer, and removing a first portion of the first conductive layer to form at least two conductive lines in the first dielectric layer, the at least two conductive lines being separated by a first spacing. The method further includes forming a capping layer on the at least two conductive lines, and forming an etch stop layer on the capping layer and the first dielectric layer.

20 Claims, 7 Drawing Sheets

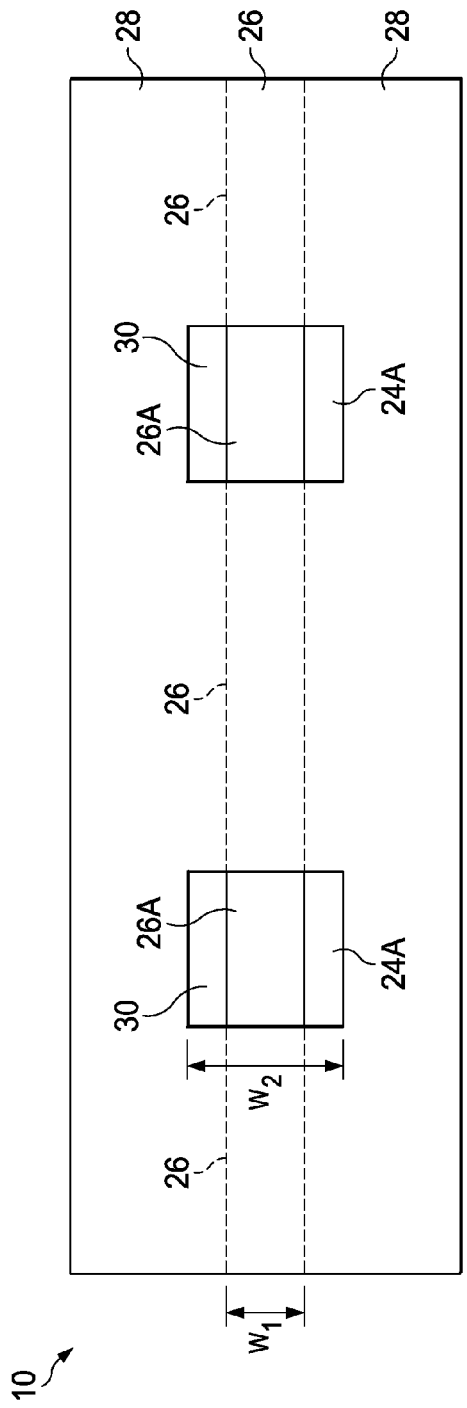
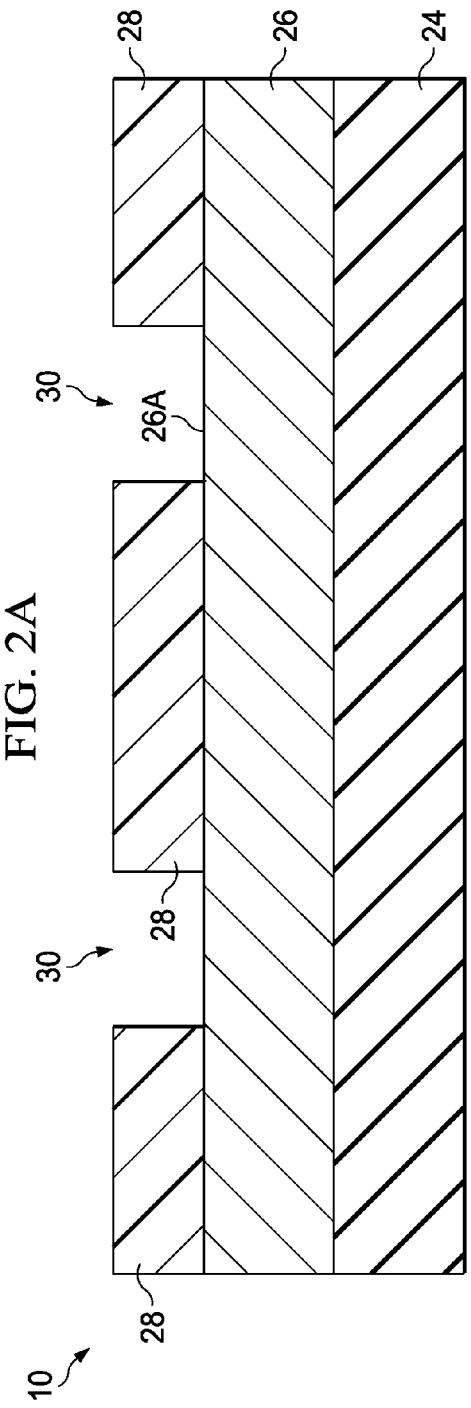
FIG. 2A
FIG. 2B

INTERCONNECT STRUCTURES AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1A through 6 are top-views and cross-sectional views of intermediate stages in the manufacturing of a semiconductor device in accordance with an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Semiconductor devices and methods of forming the same are provided in accordance with various embodiments. The intermediate stages of forming the semiconductor devices are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 5:
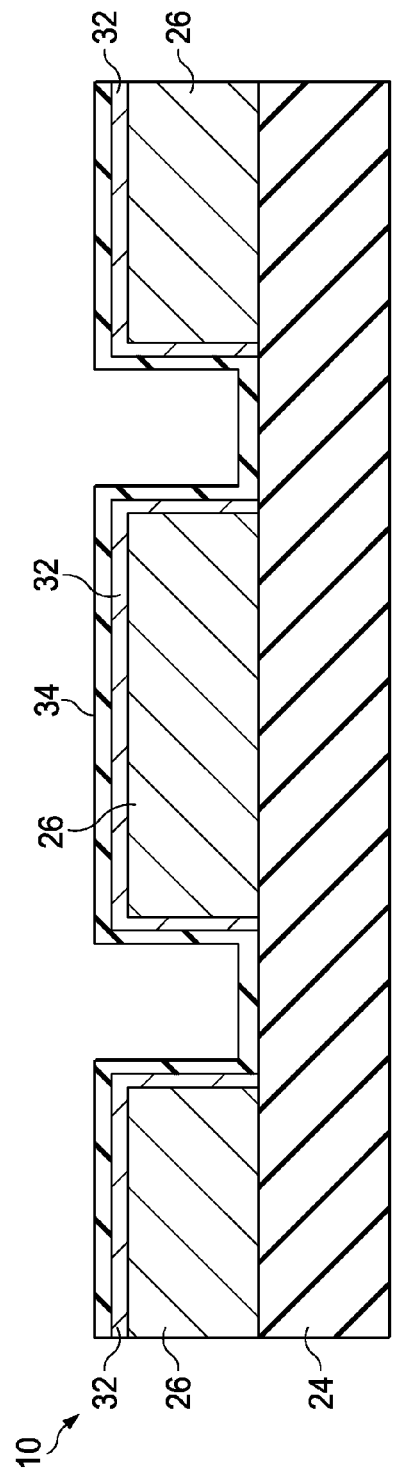
Figure 6:
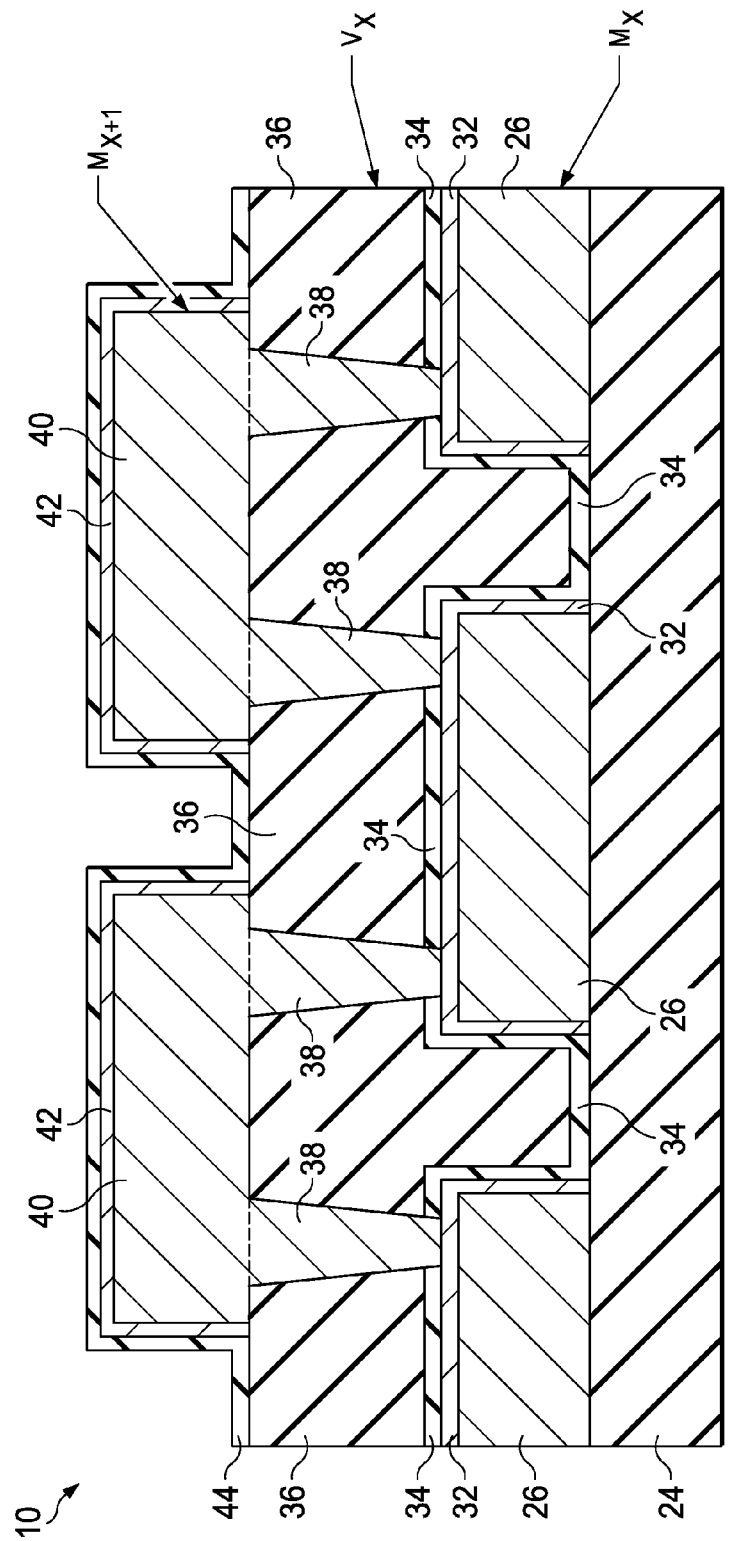
Figure 7:
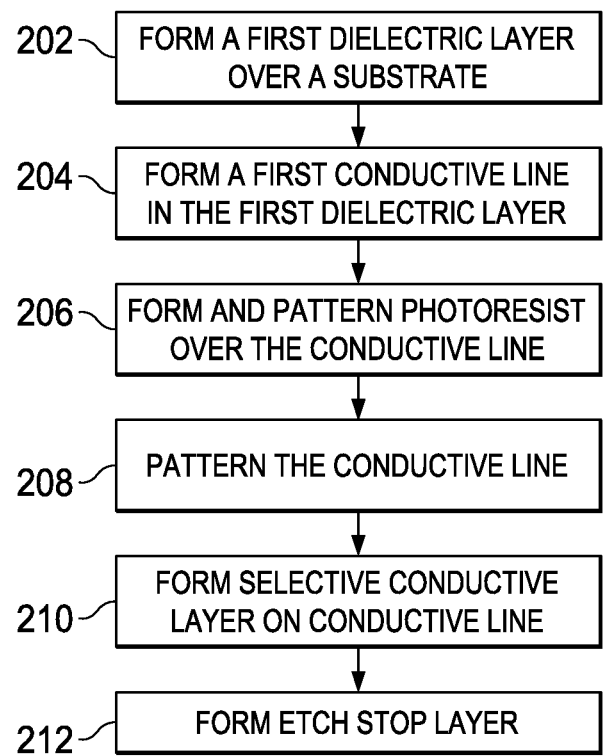
FIG. 7 is a process flow diagram of the process shown in FIGS. 1A through 6 in accordance with an embodiment.

FIGS. 1A through 6 are top-views and cross-sectional views of intermediate stages in the manufacturing of a interconnect structure in accordance with an embodiment, and FIG. 7 is a process flow of the process shown in FIGS. 1A through 6.

Figure 1A:
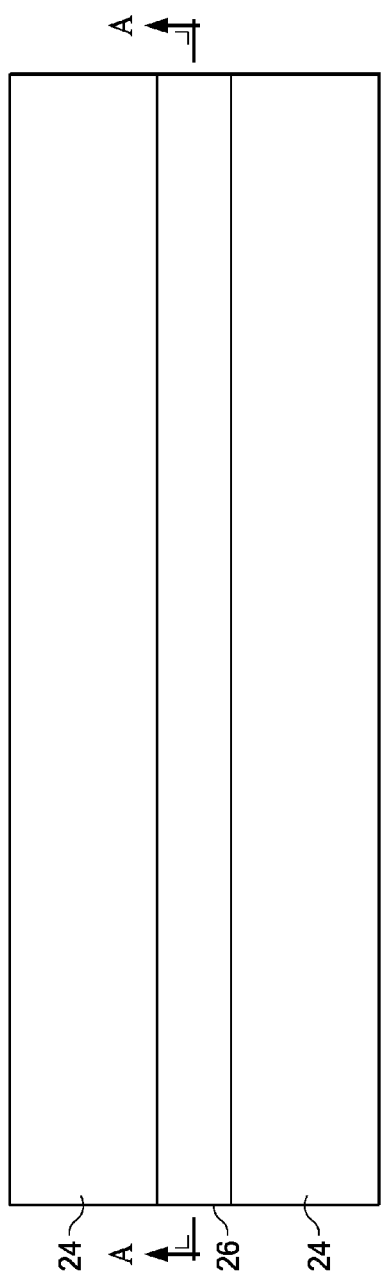
Figure 1B:
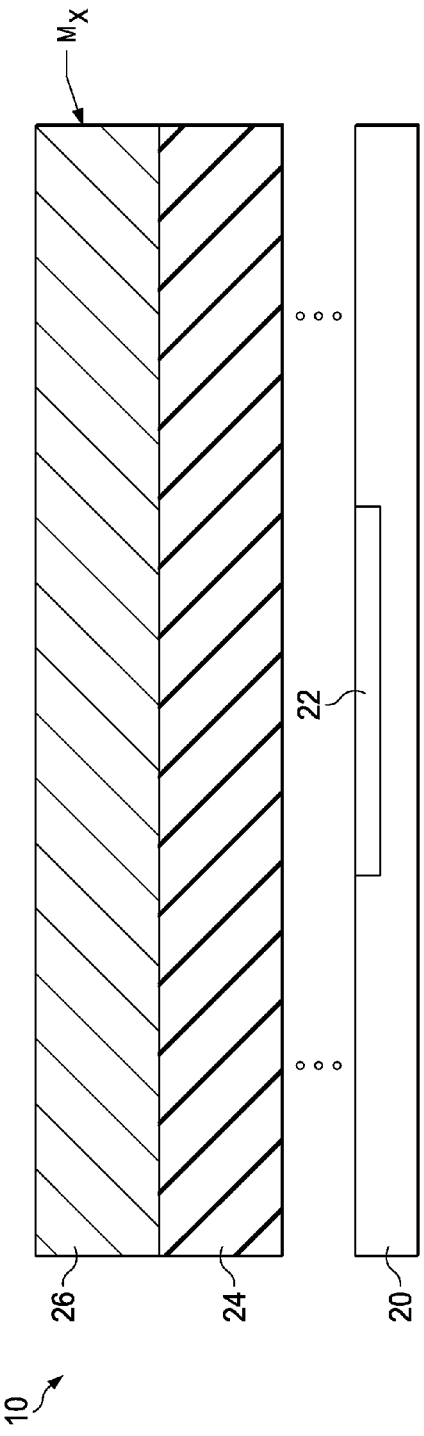

With reference now to FIGS. 1A and 1B, there is shown a semiconductor device 10 at an intermediate stage of processing according to an embodiment. FIG. 1A is a top-view of the semiconductor device 10 with FIG. 1B being a cross-sectional view of FIG. 1A along the line A-A. The semiconductor device 10 includes a substrate 20, which may be a part of a wafer, a dielectric layer 24, and a conductive line 26 in the dielectric layer 24. The substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 20 may be doped with a p-type dopant, such as boron, aluminum, gallium, or the like, although the substrate may alternatively be doped with an n-type dopant, as is known in the art.

The substrate 20 may include active and passive devices 22. As one of ordinary skill in the art will recognize, a wide variety of devices such as transistors, capacitors, resistors, combinations of these, and the like may be used to generate the structural and functional requirements of the design for the semiconductor device 10. The active and passive devices 22 may be formed using any suitable methods. Only a portion of the substrate 20 is illustrated in the figures, as this is sufficient to fully describe the illustrative embodiments.

The dielectric layer 24 is formed over the substrate 20 (step 202). The dielectric layer 24 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 24 may be deposited by chemical vapor deposition (CVD), physical vapor deposition (PVD), atomic layer deposition (ALD), a spin-on-dielectric (SOD) process, the like, or a combination thereof. In an embodiment, the dielectric layer 24 is formed directly on a top surface of the substrate 20. In other embodiments, the dielectric layer 24 is formed on intermediate layers and/or structures (not shown) which are on substrate 20. In some embodiments, the dielectric layer 24 is an inter-layer dielectric (ILD).

The conductive line 26 may be formed in the dielectric layer 24 (step 204). In some embodiments, the conductive line 26 is formed in recesses (not shown) in the dielectric layer 24. These recesses may be formed using acceptable photolithography and etching techniques such as, for example, an anisotropic dry etch. In other embodiments, the conductive line is formed and patterned on a first portion of the dielectric layer 24 (e.g. portion below the conductive line 26) with a second portion of the dielectric layer 24 being formed around the patterned conductive line 26.

A barrier layer (not shown) may be formed between the conductive line 26 and the dielectric layer 24. The barrier layer may help to block diffusion of the subsequently formed conductive line 26 into adjacent dielectric materials such as the dielectric layer 24. The barrier layer may comprise titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer may be formed by CVD, PVD, plasma enhanced CVD (PECVD), ALD, SOD, the like, or a combination thereof. In some embodiments, the barrier layer is omitted.

The conductive line 26 may be formed on the barrier layer, if the barrier layer is present. The conductive line 26 may also be referred to as a metal layer $M_X$ and may be the first metal layer ($M_1$) over the substrate or may any number metal layer over the substrate (e.g. $M_5$, $M_{10}$, $M_{100}$). The conductive line 26 may comprise copper, aluminum, the like, or a combination thereof. The conductive line 26 may be formed through a deposition process such as electrochemical plating (ECP) process, CVD, PVD, the like, or a combination thereof. In some embodiments, the conductive line 26 is formed on a seed layer, such as a copper alloy and formed by an ECP process. In an embodiment, the conductive line 26 is formed to a thickness from about 100 Å to about 7000 Å. In an embodiment, the conductive lines 26 may be planarized by a chemical mechanical polish (CMP) process or an etching process. In some embodiments, a top surface of the conductive line 26 is substantially coplanar with a top surface of the dielectric layer 24.

After conductive line 26 is formed, a photoresist 28 may be formed and patterned over the conductive line 26 (step 206) as illustrated in FIGS. 2A and 2B. FIG. 2B is a cross-sectional view of FIG. 2A along a line similar to line A-A in FIG. 1A but is not shown in FIG. 2A for clarity. A photoresist 28 may be deposited and patterned over the conductive line 26 and the dielectric layer 24. The photoresist 28 may comprise a conventional photoresist material, such as a deep ultra-violet (DUV) photoresist, and may be deposited on the top surfaces of the conductive line 26 and the dielectric layer 24, for example, by using a spin-on process to place the photoresist 28. However, any other suitable material or method of forming or placing the photoresist 28 may alternatively be utilized. Once the photoresist 28 has been formed, the photoresist 28 may be exposed to energy, e.g. light, through a patterned reticle in order to induce a reaction in those portions of the photoresist 28 exposed to the energy. The photoresist 28 may then be developed, and portions of the photoresist 28 may be removed forming openings 30, exposing portions of a top surface 26A of conductive line 26 through the openings 30. In some embodiments, the conductive line has a width $W_1$ and the opening 30 has a width $W_2$, the width $W_2$ being larger than the width $W_1$, and thus exposing portions of a top surface 24A of the dielectric layer 24 in openings 30. In other embodiments, the widths $W_2$ and $W_1$ are substantially equal such that only portions of the top surface 26A of the conductive line are exposed in the openings 30.

Figure 3A:
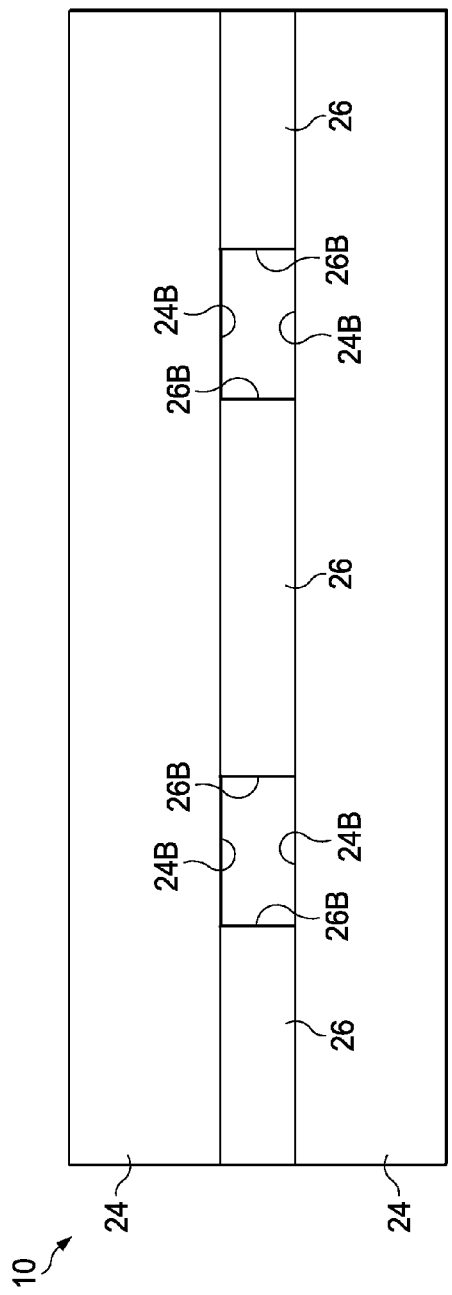
Figure 3B:
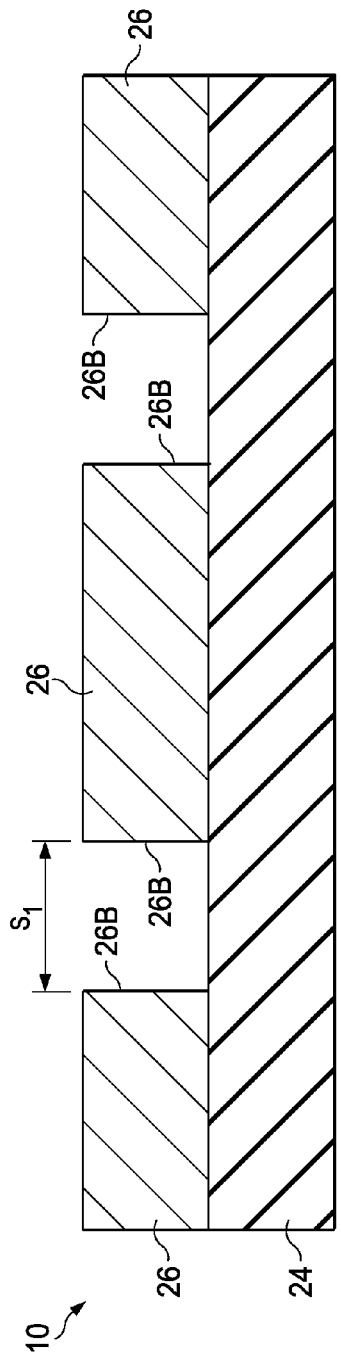
Figure 3C:
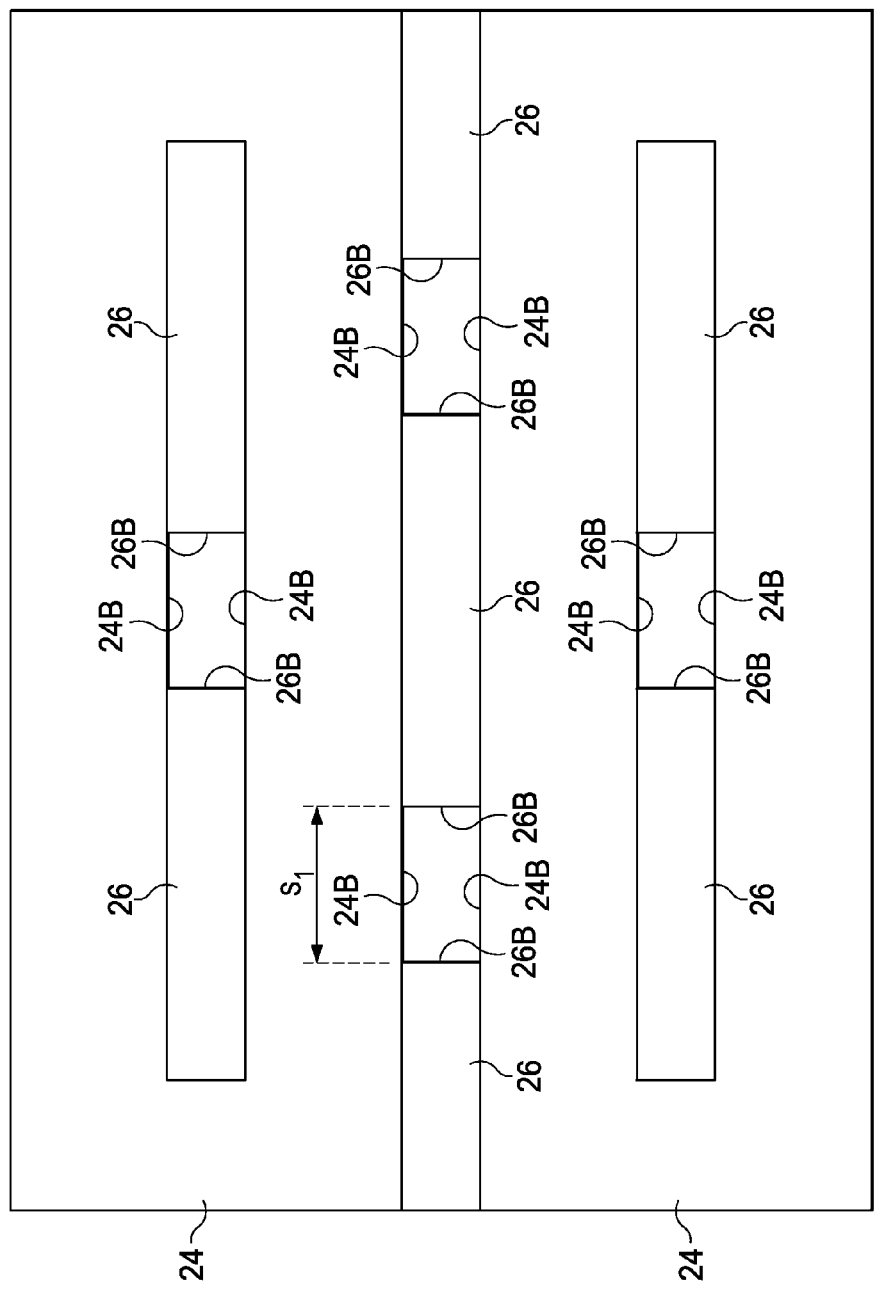

After the photoresist 28 is patterned, the conductive line 26 may be patterned (step 208) to expose a top surface 24A of the dielectric layer 24 as illustrated in FIGS. 3A and 3B. FIG. 3B is a cross-sectional view of FIG. 3A along a line similar to line A-A in FIG. 1A but is not shown in FIG. 3A for clarity. The patterning of the conductive line 26 forms multiple conductive lines 26. The conductive lines 26 may have a spacing $S_1$ between adjacent conductive lines 26 in a range from 5 nm to about 40 nm. The spacing S1 may also be referred to as an end-to-end spacing. In an embodiment, the patterning may be performed by a dry etch process or ion bombardment with a plasma/ion source and an etchant gas such as $H_2$, $NH_3$, Ar, He, $Cl_2$ the like, or a combination thereof. In some embodiments, the patterning process etches the conductive line 26 and forms recesses in the dielectric layer 24 between the patterned conductive lines 26. These recesses have sidewalls 24B of the dielectric layer and sidewalls 26B of the conductive lines 26. In the embodiments with $W_2$ being larger than $W_1$, portions of the dielectric layer 24 exposed in the openings 30 are also removed by the patterning of the conductive line 26. Although FIG. 3B illustrates three conductive lines 26 along a single longitudinal axis, there may be adjacent, parallel conductive lines 26 formed at a same time and by a same process as illustrated in FIG. 3C. Although FIGS. 3B and 3C illustrate three conductive lines 26 and seven conductive lines 26, respectively, there may be more or less conductive lines 26 as desired.

Figure 4:
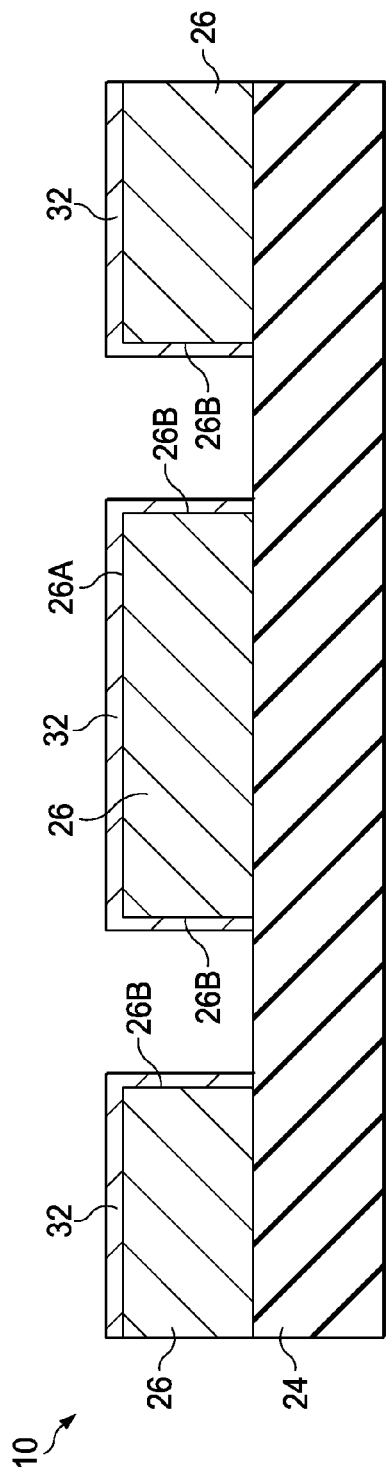

FIG. 4 through 6 are cross-sectional views of further stages of processing along a line similar to line A-A in FIG. 1A. FIG. 4 illustrates forming a selective conductive layer 32 on the conductive lines 26 (step 210). The selective conductive layer 32 may be a capping/barrier layer and will be referred to as a capping layer 32 hereinafter. In some embodiments, the capping layer 32 is formed on the top surfaces 26A of the conductive lines 26 and on the sidewalls 26B of the conductive lines 26. The capping layer 32 disposed over the conductive lines 26 improves the electromigration characteristics of the conductive lines 26 and also improves the adhesion between the subsequently formed etch stop layer 34 (see FIG. 5) and the conductive lines 26. In some embodiments, the capping layer 32 has a thickness ranging from about 10 Å to about 1000 Å formed by a deposition process including low-pressure CVD (LPCVD), CVD, PECVD, plasma-enhanced ALD (PEALD), PVD, sputtering, the like, or a combination thereof. In an embodiment, the capping layer 32 is not formed on the surface of the dielectric layer 24 but is only formed on the conductive lines 26.

The capping layer 32, for example, is a metal-containing layer. In some embodiments, the capping layer 32 includes Co, Cu, W, Al, Mn, Ru, Ta, the like, or combinations and alloys thereof. In an embodiment, the capping layer 32 includes a Co layer formed by introducing a cobalt-containing chemical such as cyclopentadienylcobalt dicarbonyl ($CPCo(CO)_2$), dicobalt octacarbonyl ($Co_2(CO)_8$), or decamethylcobaltocene ($CoCp_2$) with a plasma source such as $H_2$, $NH_3$, Ar, He, the like, or a combination thereof in which the semiconductor device 10 is being processed. In some embodiments, the capping layer 32 is selectively formed on the conductive lines 26. In other embodiments, the capping layer 32 is formed entirely over the semiconductor device 10 and then subjected to a patterning process to remove the portion of capping layer 32 on the dielectric layer 24, while leaving another portion of capping layer 32 on the conductive lines 26.

FIG. 5 illustrates the formation of an etch stop layer (ESL) 34 on the capping layers 32 and the dielectric layer 24 (step 212). The ESL 34 acts as an etch stop layer for the subsequent formation of conductive vias 38 to the conductive lines 26 (see FIG. 6). The ESL 34 may be made of one or more suitable dielectric materials such as silicon oxide, silicon carbide, oxygen doped silicon carbide, nitrogen doped silicon carbide, silicon nitride, aluminum oxide, aluminum nitride, aluminum oxynitride, combinations of these, or the like. The ESL 34 may be deposited through a process such as CVD, an SOD process, although any acceptable process may be utilized to form the ESL 34.

FIG. 6 illustrates the semiconductor device 10 after a via layer $V_X$ is formed over the conductive lines 26 of the metal layer $M_X$ and another metal layer $M_{X+1}$ is formed on the via layer $V_X$. The semiconductor device 10 may also be referred to as an interconnect structure 10. After the ESL 34 is formed, a dielectric layer 36 is formed over the ESL 34. The dielectric layer 36 may be formed of oxides such as silicon oxide, BPSG, USG, FSG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 36 may be deposited by CVD, PVD, ALD, an SOD process, the like, or a combination thereof. In some embodiments, the dielectric layer 36 is an ILD. In an embodiment, the dielectric layer 36 has a bottom surface portion lower than top surfaces of the conductive lines 26.

After the dielectric layer 36 is formed, openings (not shown) may be formed through the dielectric layer 36 and the ESL 34 to expose portions of the capping layer 32 and/or the conductive lines 26. The openings allows for the electrical and physical coupling between the conductive line 26 and the conductive vias 38. The openings may be formed using a suitable photolithographic mask and etching process, although any suitable process to expose portions of the capping layer 32 and/or conductive lines 26 may be used.

After the openings are formed through the dielectric layer 36, the conductive vias 38 are formed in the openings. In some embodiments, the conductive vias 38 include a barrier layer (not shown) formed in the openings. The barrier layer helps to block diffusion of the subsequently formed conductive vias 38 into adjacent dielectric materials such as the dielectric layer 36. The barrier layer may be formed of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, PBO, the like, or a combination thereof. The barrier layer may be formed by CVD, PVD, PECVD, ALD, SOD, the like, or a combination thereof. In some embodiments, the barrier layer is omitted.

The conductive vias 38 are formed in the openings and, if present, on the barrier layer. The conductive vias 38 electrically couple the conductive lines 26 in the metal layer $M_X$ below and subsequently formed conductive lines 40 in the layers $M_{X+1}$ above. The conductive vias 38 may be formed of copper, aluminum, the like, or a combination thereof. The conductive vias 38 may be formed through a deposition process such as electrochemical plating, CVD, PVD, the like, or a combination thereof. In an embodiment, the conductive vias 38 are formed on a seed layer (not shown), such as a copper alloy and formed by an ECP process. In some embodiments, the conductive vias 38 extend through the capping layer 32 to directly contact the conductive lines 26. In other embodiments, the conductive vias 38 do not extend through the capping layer 32

In some embodiments, the conductive vias 38 are planarized by a CMP process or an etching process. In these embodiments, the conductive vias 38 have a top surface that is substantially coplanar with the top surface of the dielectric layer 36.

After the conductive vias 38 are formed, the conductive lines 40 are formed on the conductive vias 38 and the dielectric layer 36. In some embodiments, the conductive lines 40 may be formed by similar materials and processes as the conductive lines 26 described above and the descriptions are not repeated herein, although the conductive lines 40 and 26 need not be the same. In other embodiments, the conductive vias 38 and the conductive lines 40 could be formed by a damascene process, such as a dual damascene process any other suitable process to form conductive vias and lines.

After the conductive lines 40 are formed, a capping layer 42 and an ESL 44 are formed over the conductive lines 40.

The capping layer 42 improves the electromigration characteristics of the conductive lines 40 and also improves the adhesion between the subsequently formed etch stop layer 44 and the conductive lines 40. The capping layer 42 may be selectively formed on the conductive lines 40 but not on the dielectric layer 36. The capping layer 42 may be formed by similar materials and processes as the capping layer 32 described above and the descriptions are not repeated herein, although the capping layers 42 and 32 need not be the same.

The ESL 44 is formed on the capping layers 42 and the dielectric layer 36. The ESL 44 acts as an etch stop layer for the subsequent conductive features (not shown) formed to the conductive lines 40. The ESL 44 may be formed by similar materials and processes as the ESL 34 described above and the descriptions are not repeated herein, although the ESLs 44 and 34 need not be the same.

The number of conductive lines 26 and 40 and metal layers $M_X$ and $M_{X+1}$ are only for illustrative purposes and are not limiting. There could be any suitable number conductive lines 26 and 40 and metal layers $M_X$ and $M_{X+1}$. For example, there could be two more metal layers $M_{X+2}$ and $M_{X+3}$ formed over the metal layer $M_{X+1}$ and formed in a similar manner as described above. Further, there may be devices, structures, and/or connectors formed over and electrically coupled to the metal layers $M_X$ through $M_{X+1}$ and the active and passive devices 22 to form functional circuitry.

It has been found that forming the conductive line in a dielectric layer and then etching it to form separate conductive lines allows the end-to-end spacing between the conductive lines to shrink. This improves the reliability of 10 nm technology node and even smaller future technology nodes. The process includes a selective capping layer between the conductive lines and an etch stop layer to improve adhesion of the etch stop layer. Also, the profile shape of the conductive lines can be controlled better than the profile of a conductive line formed with a double-patterning process. The etched conductive lines process is also a simpler process than a double-patterning process which reduces the process stage and the overall cost of the device.

An embodiment is a method of forming a semiconductor device, the method including forming a first dielectric layer over a substrate, forming a first conductive layer in the first dielectric layer, and removing a first portion of the first conductive layer to form at least two conductive lines in the first dielectric layer, the at least two conductive lines being separated by a first spacing. The method further includes forming a capping layer on the at least two conductive lines, and forming an etch stop layer on the capping layer and the first dielectric layer.

Another embodiment is a method of forming a interconnect structure, the method including forming a first dielectric layer over a substrate, forming a first conductive layer in the first dielectric layer, and etching the first conductive layer to form a first conductive line and a second conductive line, the first conductive line being separated from the second conductive line by a first spacing. The method further includes forming a first capping layer on top surfaces and sidewalls of the first and second conductive lines, forming a first etch stop layer on the first capping layer and the first dielectric layer, and forming a second dielectric layer over the etch stop layer, the second dielectric layer adjoining top surfaces and sidewalls of the etch stop layer.

A further embodiment is an interconnect structure including a first dielectric layer over a substrate, a first metal line in the first dielectric layer, and a second metal line in the first dielectric layer, the second metal line laterally separated from the first metal line by a first spacing. The interconnect structure further includes a capping layer on top surfaces and sidewalls of the first and second metal lines, and a second dielectric layer over the capping layer, the second dielectric layer having a bottom surface lower than top surfaces of the first and second metal lines.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a first dielectric layer over a substrate;
    forming a first conductive layer in the first dielectric layer;
    removing a first portion of the first conductive layer to form at least two conductive lines in the first dielectric layer, the at least two conductive lines being separated by a first spacing;
    forming a capping layer on the at least two conductive lines; and
    forming an etch stop layer on the capping layer and the first dielectric layer.

2. The method of claim 1, wherein the capping layer is formed on top surfaces and sidewalls of the at least two conductive lines.

3. The method of claim 1, wherein the capping layer is a cobalt layer formed using cyclopentadienylcobalt dicarbonyl, dicobalt octacarbonyl, decamethylcobaltocene, or a combination thereof.

4. The method of claim 1, wherein the first dielectric layer and the first conductive layer have top surfaces which are coplanar.

5. The method of claim 1, wherein the first spacing is from about 5 nm to about 40 nm.

6. The method of claim 1 wherein removing the first portion of the first conductive layer to form at least two conductive lines in the first dielectric layer comprises:
    forming a photoresist over the first conductive layer and the first dielectric layer;
    patterning the photoresist to expose the first portion of the first conductive layer; and
    performing a dry etch process to remove the first portion of the first conductive layer.

7. The method of claim 1, wherein removing the first portion of the first conductive layer to form at least two conductive lines in the first dielectric layer exposes a second portion of the first dielectric layer, the second portion of the first dielectric layer being directly below the first portion of the first conductive layer.

8. The method of claim 1 further comprising:
    forming a second dielectric layer over the etch stop layer;
    forming at least two conductive vias through the second dielectric layer to the at least two conductive lines; and
    forming at least two other conductive lines on the at least two conductive vias.

9. The method of claim 8, wherein the second dielectric layer comprises a third portion laterally between the at least two conductive lines.

10. A method of forming an interconnect structure, the method comprising:
    forming a first dielectric layer over a substrate;
    forming a first conductive layer in the first dielectric layer;
    etching the first conductive layer to form a first conductive line and a second conductive line, the first conductive line being separated from the second conductive line by a first spacing;
    forming a first capping layer on top surfaces and sidewalls of the first and second conductive lines;
    forming a first etch stop layer on the first capping layer and the first dielectric layer; and
    forming a second dielectric layer over the etch stop layer, the second dielectric layer adjoining top surfaces and sidewalls of the etch stop layer.

11. The method of claim 10, wherein the second dielectric layer has a bottom surface lower than top surfaces of the first and second conductive lines.

12. The method of claim 10, wherein forming the first capping layer on top surfaces and sidewalls of the first and second conductive lines comprises performing a selective deposition process using cyclopentadienylcobalt dicarbonyl, dicobalt octacarbonyl, decamethylcobaltocene, or a combination thereof.

13. The method of claim 10, wherein the first dielectric layer and the first conductive layer have top surfaces which are coplanar.

14. The method of claim 10, wherein the first spacing is from about 5 nm to about 40 nm.

15. The method of claim 10, wherein etching the first conductive layer to form the first conductive line and the second conductive line comprises performing a dry etch process on a portion of the first conductive layer and a portion of the first dielectric layer.

16. The method of claim 10 further comprising:
    forming a plurality of conductive vias in the second dielectric layer;
    forming at least two conductive lines on the plurality of conductive vias;
    forming a second capping layer on top surfaces and sidewalls of the at least two conductive lines; and
    forming a second etch stop layer on the second capping layer and the second dielectric layer.

17. A method comprising:
    forming a first dielectric layer over a substrate;
    forming a first metal layer in the first dielectric layer;
    etching the first metal layer to form a first metal line and a second metal line, the first metal line being separated from the second metal line by an opening in the first metal layer, the first opening having a first spacing;
    forming a first metal-containing capping layer on top surfaces and sidewalls of the first and second metal lines, the first metal-containing capping layer extending to sidewalls of the opening;
    forming a first etch stop layer on the first metal-containing capping layer and the first dielectric layer, the first etch stop layer being on a bottom surface of the opening; and
    forming a second dielectric layer over the first etch stop layer and filling the opening, the second dielectric layer adjoining top surfaces and sidewalls of the first etch stop layer.

18. The method of claim 17, wherein forming the first metal-containing capping layer on top surfaces and sidewalls of the first and second metal lines comprises performing a selective deposition process using cyclopentadienylcobalt dicarbonyl, dicobalt octacarbonyl, decamethylcobaltocene, or a combination thereof.

19. The method of claim 17, wherein the first dielectric layer and the first metal layer have top surfaces which are coplanar.

20. The method of claim 17 further comprising:
 forming a plurality of metal vias in the second dielectric layer;
 forming at least two metal lines on the plurality of metal vias;
 forming a second capping layer on top surfaces and sidewalls of the at least two metal lines; and
 forming a second etch stop layer on the second capping layer and the second dielectric layer.

* * * * *